July 31, 1956

C. L. WANLASS 2,757,286

TRANSISTOR MULTIVIBRATOR

Filed April 5, 1954

2 Sheets-Sheet 1

INVENTOR.
CRAVENS L. WANLASS
BY William R Lane
ATTORNEY

July 31, 1956 C. L. WANLASS 2,757,286

TRANSISTOR MULTIVIBRATOR

Filed April 5, 1954 2 Sheets-Sheet 2

INVENTOR.
CRAVENS L. WANLASS

BY William R. Lane

ATTORNEY 2,757,286
Patented July 31, 1956

1

2,757,286

TRANSISTOR MULTIVIBRATOR

Cravens L. Wanlass, Whittier, Calif., assignor to North American Aviation, Inc.

Application April 5, 1954, Serial No. 421,006

11 Claims. (Cl. 250—36)

This invention relates to relaxation oscillators and, more particularly, to multivibrators using transistors. A multivibrator is an electronic device which provides an abrupt change from one output to a second output; and in order to employ this output most advantageously, it is necessary that the impedance of the multivibrator and the circuit it drives be comparable. A transistor being inherently a low impedance device requires that it operate into a low impedance circuit. The multivibrator may or may not require a trigger pulse to cause it to change state.

Multivibrators which employ transistors take advantage of the fact that transistors dissipate less heat, require less power, and are more compact than the conventional electronic tube. Utilizing a large number of such multivibrators in a small space may make each one of these aspects an important consideration. It also appears that, in the future, their reliability will be superior to the electronic tube.

Ordinarily, the multivibrator is composed of a pair of coupled amplifying devices, such as transistors or tubes. At alternate intervals, the output of one is used to bias the other to cut-off and vice versa. A conventional method by which this bias is retained for a given length of time is by the use of an R–C circuit. A non-conducting electronic tube held at cut-off by the voltage on a capacitor exhibits high impedance. Spurious and transient efforts do not operate to change the state of a multivibrator using tubes. Transistors are composed of semiconductive material such as silicon or germanium and adjacent electrodes called "emitter" and "collector" plus a "base" or "control" electrode. These semiconductive devices exhibit relatively low impedance even when nonconducting and some additional means is necessary to provide a reliable control over the conduction or nonconduction of the transistor, or, what is the same, over the state of the multivibrator.

This invention proposes holding the non-conducting transistor at cut-off by a diode acting as an open switch which is held open as long as the conducting transistor continues to conduct. Providing switching diodes in the transistor circuit is an additional advantage in that added protection of the transistors is obtained.

The particular invention herein described is one of simplicity, and its reliability is not dependent upon the power withdrawn from the circuit if withdrawn in the manner taught herein.

It is an object therefore of this invention to provide an improved multivibrator.

It is another object of this invention to provide a transistor multivibrator with improved control over the separate states of said multivibrator.

It is another object of this invention to provide a transistor multivibrator circuit having a low output impedance.

A still further object of this invention is to provide a transistor type multivibrator having an improved output circuit.

2

Other objects of invention will become apparent from the following description taken in connection with the accompanying drawings, in which Fig. 1 is a schematic of the device of the invention;

Figure 1:
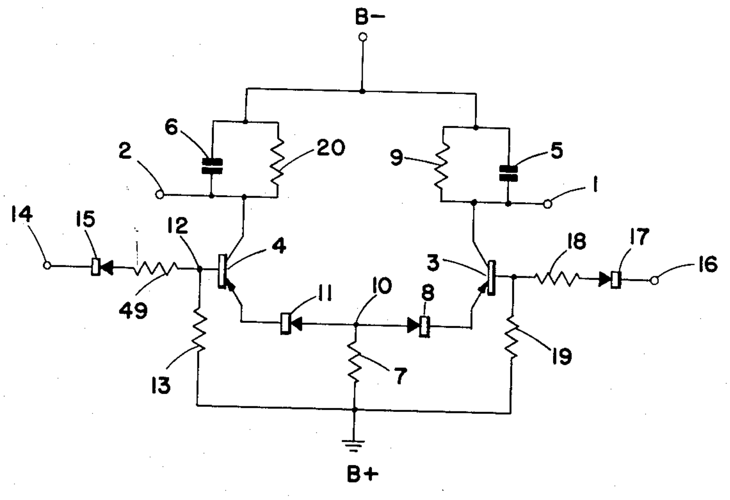

Assume that the multivibrator circuit of Fig. 1 is designed to be bistable, that is, has two stable states. Such a circuit is commonly termed a "flip-flop." At the commencement of operation, say, point 1 is in the false or more positive state and point 2 is in the true or more negative state. This indicates that transistor 3 is conducting and that transistor 4 is not conducting. A source of operating potential for the transistors is supplied by a B supply having its positive terminal connected to ground and its negative terminal connected to establish the operating potential across the transistors 3 and 4. The transistors illustrated are point contact with the emitter arrows pointing in the direction of conventional current flow. Assume also that the charges on the two capacitors 5 and 6 of the output stages of the flip-flop circuit are stabilized, that is, the transistor flip-flop has remained in one state for a sufficient length of time to establish these charges. Therefore, current is flowing through resistor 7, diode 8, transistor 3, and resistor 9. This current flow causes point 10 to be more negative than the emitter of transistor 4, and thus causes diode 11 to be biased in the back or high resistance direction. The bias of diode 11 in the high resistance direction causes the emitter circuit of transistor 4 to be open circuited and thus unable to conduct. The base of transistor 4 or point 12 is returned to ground through resistor 13. Therefore, the base of transistor 4 is also positive with respect to point 10. The result is that this transistor circuit is self-stabilizing and will remain in a given state until disturbed by an input trigger pulse.

Assume that a trigger pulse of negative amplitude is presented to point 14 and diode 15. The trigger pulse is more negative than point 10 and therefore diode 11 conducts and causes point 10 to become even more negative than it was. Point 10 is thus made more negative than the emitter of transistor 3 and diode 8 is biased in the back or high resistance direction. Diode 8 thus opens the emitter circuit of transistor 3 causing the current through this transistor to be greatly reduced with the net result the circuit is caused to change state. When the trigger pulse is removed, the emitter potential of transistor 3 rises, and the circuit remains in the triggered state until triggered again to return to the first state.

In order to trigger this circuit to the first-mentioned state, at point 16 is received the pulse which is to flip the circuit back to its alternate state. A negative pulse received at diode 17 lowers the potential of the base of transistor 3 through resistor 18. The emitter of transistor 3 commences conducting and lowers the voltage across diode 8 so as to allow current to flow therethrough and point 10 is again lowered in potential causing diode 11 to be an open circuit, and transistor 4 ceases conducting.

The output of the device, that is, an indication of which transistor is conducting, is obtained at points 1 and 2. Resistors 13 and 19 provide a return path to ground for the base of the respective transistors. Resistor 7 provides emitter bias with respect to ground. Capacitors 5 and 6, together with their respective resistors 9 and 20, provide a low impedance circuit for the storage of electrical energy.

Flip-flops are commonly used in computer circuits where a single flip-flop may receive pulses depending on the state of several other flip-flops.

Figure 2:
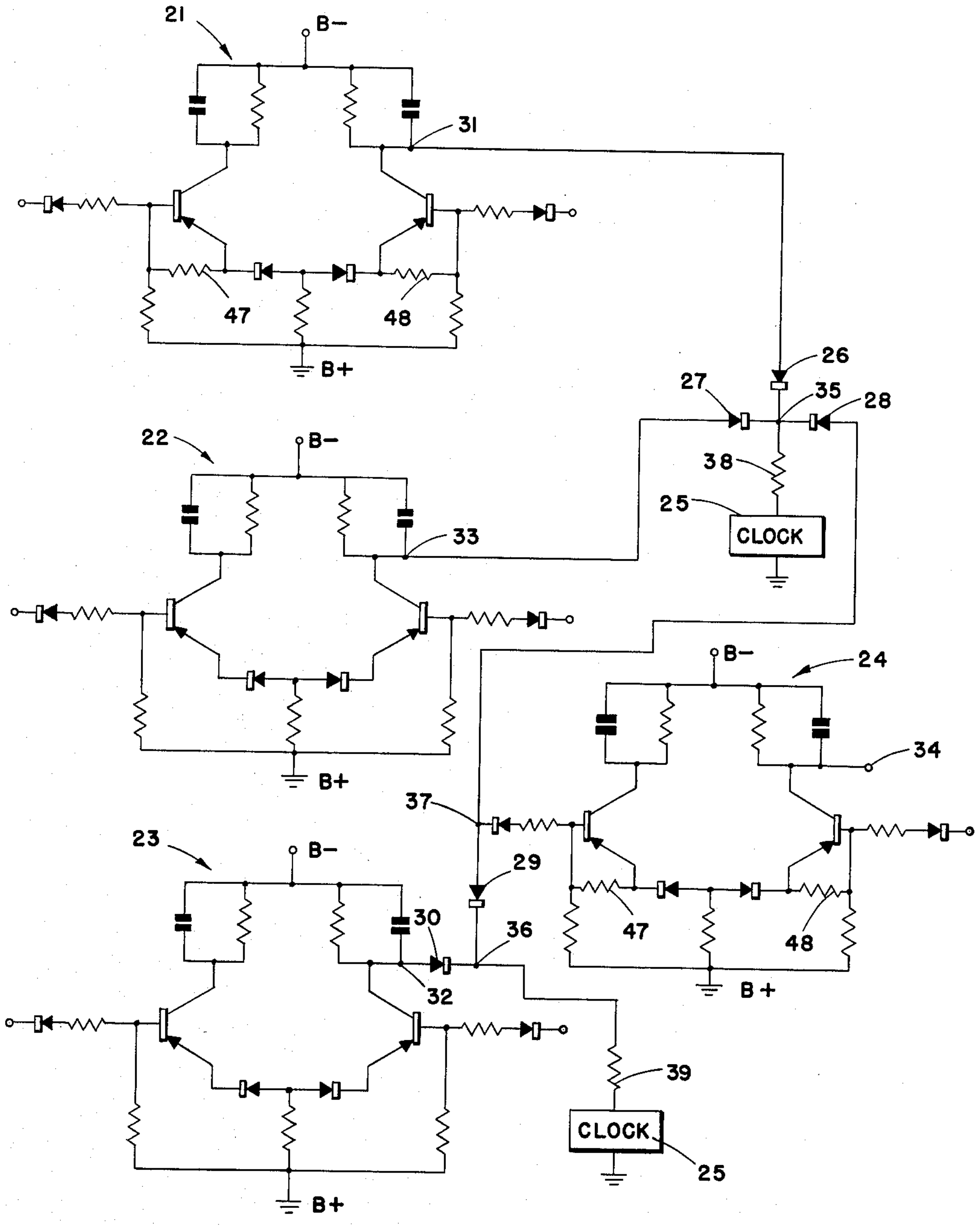
Fig. 2 is an embodiment of several of the devices of the invention.

Fig. 2 indicates how the several flip-flops are used together with a method of extracting energy from each flip-flop. The energy is withdrawn from the flip-flop at spaced intervals. During the longer period of time between the intervals, energy is being stored. In Fig. 2, flip-flops 21, 22, and 23 provide signals to flip-flop 24. A source of negative pulses termed a "clock" 25 passes or "gates" the information from the flip-flops 21, 22, and 23 to flip-flop 24. Clock 25 is a pulse generator or oscillator whose intervals between pulses are longer than the pulse width. Diodes 26, 27, 28, 29, and 30 provide the logical circuitry which determines how flip-flop 24 responds to the various states of flip-flops 21, 22, and 23.

Assume that output point 31 of flip-flop 21 is in the true or more negative state and that output point 32 of flip-flop 23 is in the true or more negative state. Output point 33 of flip-flop 22 is in the false or more positive state and likewise the output point 34 of flip-flop 24 is in the false or more positive state. When the clock pulse is applied, the voltage at point 35 becomes equal to the higher of points 31 and 33. Therefore, the voltage at point 35 becomes equal to 33, or the voltage level of the false state. Likewise, the potential at point 36 becomes equal to the potential at point 32. In the same manner, the voltage at point 37 becomes equal to the lower of points 35 and 36, or in this case 36. Therefore, flip-flop 24 is triggered and changes state. Resistors 38 and 39 and diodes 28 and 29 form a logical "or" gate since point 37 becomes true and flip-flop 24 is triggered if either point 35 "or" point 36 are true, or in the more negative state.

The use of the capacitor in the output stage of each of these flip-flops has the added advantage that energy is stored between clock pulses. This means that a large amount of energy may be removed in a short time while the clock is pulsing the circuit without affecting the stability of the circuit. Also, current may flow into the capacitor at a relatively low rate after the clock pulse disappears since the current flows into the capacitor over a much longer period of time than the clock pulse causes it to flow out. Further, until a clock pulse is present, each flip-flop is isolated from all external loads. In comparison, then, no matching transformer between flip-flops is necessary.

Figure 3:
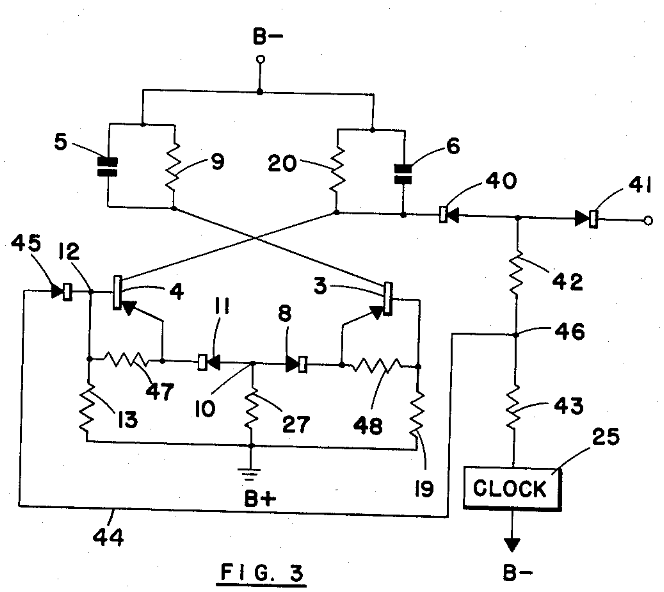
Fig. 3 is an embodiment of the device of the invention modified to receive a positive trigger pulse.

Fig. 3 illustrates the modification of the device in order to utilize a positive pulsing clock source instead of negative pulsing source as indicated before. The cathode of diode 40 is connected to capacitor 6. The anode of diode 41 is connected to the anode of diode 40. At the common connection of anodes of diodes 40 and 41 is connected resistor 42 in series with resistor 43. Wire 44 connected between resistors 42 and 43 is connected to diode 45. Clock 25, which in this instance provides a positive pulse, is connected to resistor 43. Assume that transistor 4 is conducting and capacitor 6 has a positive charge across it. Point 46 will become positive with respect to point 12 because of previously chosen values of resistors 42 and 43. Diode 45 will conduct and transistor 4 will cut off due to point 12 rising in potential to that of point 46. When transistor 4 cuts off, diode 11 also cuts off, and point 10 rises in potential. Diode 8 then conducts and so does transistor 3. The circuit has thus been caused to change state by a positive pulse.

Typical circuit values, in which a point contact transistor and germanium point contact diode types are used, are resistors 9 and 20, 3900 ohms, resistors 18 and 49, 2000 ohms, 13 and 19, 3900 ohms, and 7, 2000 ohms. Capacitors 5 and 6 are .0027 microfarad for 100 kc. operation. The amplitude of the trigger pulses received at points 14 and 16 should be approximately 10 volts. The B supply should be approximately −25 volts.

It is a particular feature of this invention that as one transistor conducts, the other transistor lies in a high impedance path. Therefore, this multivibrator reliably maintains a given state without undue influence by spurious or extraneous electrical effects.

This multivibrator has been treated thus far as bistable. However, utilizing the concept of the invention, it is readily adapted to acquire either free running or monostable characteristics. A monostable multivibrator may be described as one which has two states and upon a triggering pulse changes to its second state. However, it spontaneously thereafter reverts to its original state. In order to modify the circuit of Fig. 1 to make this multivibrator monostable, it is only necessary that the relative values of certain components be changed. Resistor 19, Fig. 1, may be increased, approximately doubled, in order to do this. This changes the potential of the base electrode, and the current then flowing through transistor 3 is not sufficient to maintain point 10 at a low potential to keep diode 11 from again commencing to conduct. When transistor 4 commences to conduct, unaltered resistance 13 maintains the base electrode of transistor 4 at a potential so that sufficient current flows through transistor 4 to keep point 10 low enough to prevent transistor 3 from conducting. The circuit is, consequently, monostable.

A free running multivibrator is one which is oscillatory, that is, first one transistor conducts and then the other, without any required triggering. In order to acquire this, the circuit of Fig. 1 is modified in that resistor 7 is decreased in value to approximately 1000 ohms. As a result, as one transistor conducts and its R-C circuit becomes charged, the transistor ceases conducting, and the other transistor commences conducting and cuts off the first transistor. Free running may also be accomplished by changing the values of the base resistors 13 and 19.

It may be noted in Figs. 2 and 3 that added resistors 47 and 48 connect the emitter of each transistor to its base. Each of these resistors is 2000 ohms. They are not required, but aid in stabilizing the circuit under adverse conditions.

Although the invention has been described and illustrated in detail, it is to be clearly understood that the same is by way of illustration and example only and is not to be taken by way of limitation, the spirit and scope of this invention being limited only by the terms of the appended claims.

I claim:

1. In a multivibrator, a pair of semiconductive devices, each having a control electrode, a collector electrode and an emitter electrode, means for applying operating potentials to said semiconductive devices, comprising reactive impedances connected in the collector circuit of said semiconductive device and a pair of diodes each connected in circuit with a respective emitter electrode and to a common resistive impedance.

2. In a multivibrator, a pair of semi-conductive devices, each having a base electrode, a collector electrode, and an emitter electrode, a source of operating potential, a pair of reactive impedances each connecting a respective collector electrode to one terminal of said source of operating potential, a pair of diodes whose cathodes are connected to respective emitter electrodes and whose anodes are connected together, a resistive impedance connected from the other terminal of said source of potential to the anodes of said diodes, and means for placing a bias on each said base electrode relative to its respective emitter.

3. The combination recited in claim 2 wherein is included means for applying a pulse to at least one of said semiconductive devices to increase the current flow therethrough and cause said multivibrator to change state.

4. The combination recited in claim 2 wherein said means for placing a bias on each said base electrode comprises a resistor connected between said base electrode of said first semiconductive device, and said other terminal of said source of potential, and a resistor connected between said base electrode of said second semiconductive device and said other terminal of said source of potential.

5. The combination recited in claim 2 wherein is included means for applying a negative pulse to the base electrode of at least one of said pair of semiconductive devices comprising a resistor connected to said base electrode, and a diode whose anode is connected to said resistor.

6. In a multivibrator, a source of operating potential, a pair of transistors, a pair of parallel R-C circuits each connected from respective transistor collectors to one terminal of said source of operating potential, a resistor connected to the other terminal of said source of operating potential, a pair of diodes whose anodes are connected together at said resistor and whose cathodes are connected to respective emitters of said transistors, and a pair of resistors connected from the base of respective transistors to said other terminal of said source of operating potential.

7. The combination recited in claim 6 wherein is included a pair of resistors connected from respective transistor bases to respective transistor emitters.

8. In a bistable multivibrator, a pair of semiconductive devices, each having a base electrode, a collector electrode, and an emitter electrode, a source of operating potential, a pair of reactive impedances each connecting a respective collector electrode to one terminal of said operating potential source, a pair of diodes whose cathodes are connected to respective emitter electrodes and whose anodes are connected together, a resistor connected from the other terminal of said source of operating potential to the anodes of said diodes, means for applying a bias to the base of each semiconductive device relative to its respective emitter, said diodes being operated at a potential so that when one of said semiconductive devices is conducting, the diode in the emitter circuit of the alternate semiconductive device is an open circuit, and means for triggering said semiconductive devices so as to cause them to conduct.

9. A bistable multivibrator comprising a pair of semiconductive devices having a base electrode, a collector electrode, and an emitter electrode, means for applying operating potentials to said semiconductive devices, comprising reactive impedances connected in the collector circuit of said semiconductive devices and a pair of diodes each connected to a respective emitter electrode and to a common resistive impedance, an output circuit for said multivibrator comprising diode gating means connected in the collector circuit of at least one of said semiconductive devices, and a pulse source connected to bias said diode gating means in a low resistance direction at intermittent intervals.

10. A bistable multivibrator comprising a pair of semiconductive devices having a base electrode, a collector electrode, and an emitter electrode, means for applying operating potentials to said semiconductive devices alternatively, comprising a source of operating potential and reactive impedances connected in series in the collector circuit of said semiconductive devices and a pair of diodes each connected to a respective emitter electrode and to a common resistive impedance, and an output circuit for said multivibrator comprising a diode one of whose terminals is connected to the collector of one of said semiconductive devices, a resistive impedance connected to the other terminal of said diode, and a pulse source connected to said resistor.

11. A bistable multivibrator comprising a pair of semiconductive devices having a base electrode, a collector electrode, and an emitter electrode, means for applying operating potentials to said semiconductive devices alternatively, comprising a D. C. source of operating potential and reactive impedances connected in series in the collector circuit of said semiconductive devices and a pair of diodes each connected to a respective emitter electrode and to a common resistive impedance, an output circuit for said multivibrator comprising diode gating means connected on one side to the collector circuit of at least one of said semiconductive devices, a resistor connected to the other side of said diode and a source for negatively pulsing said resistor at intervals spaced farther apart than the pulse width.

References Cited in the file of this patent

Article: "A Stabilized General Purpose Two-Transistor Binary Counter," by R. L. Trent; pages 469 to 482 of *The Transistor,* published by Bell Laboratories Inc., December 4, 1951. (Copy in Division 51.)

Article: "Anticoincidence or 'Not and' Gate," by L. W. Hussey; pages 517 to 522 of *The Transistor,* by Bell Laboratories Inc., December 4, 1951. (Copy in Division 51.)